United States Patent
Yoo et al.

(10) Patent No.: US 6,343,090 B1
(45) Date of Patent: Jan. 29, 2002

(54) SINGLE MODE SURFACE EMITTING LASER

(75) Inventors: Byueng Su Yoo; Hye Yong Chu; Hyo Hoon Park; Kyung Sook Hyun; El Hang Lee, all of Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 09/141,794

(22) Filed: Aug. 28, 1998

(30) Foreign Application Priority Data

Nov. 29, 1997 (KR) .............................. 97-64813

(51) Int. Cl.$^7$ ................................ H10S 3/08
(52) U.S. Cl. ..................... 372/96; 372/96; 372/75; 372/45; 372/6; 372/64
(58) Field of Search .................. 372/96, 43, 75, 372/45, 6, 64, 50, 46, 19, 20, 27, 49; 438/32

(56) References Cited

U.S. PATENT DOCUMENTS

| | | | | |
|---|---|---|---|---|
| 4,951,292 A | * | 8/1990 | Kuindersma et al. | 372/49 |
| 5,088,099 A | * | 2/1992 | Chen et al. | 372/45 |
| 5,245,622 A | | 9/1993 | Jewell et al. | 372/45 |
| 5,319,657 A | * | 6/1994 | Otsuka et al. | 372/43 |
| 5,438,585 A | * | 8/1995 | Armour et al. | 372/45 |
| 5,557,627 A | * | 9/1996 | Schneider, Jr. et al. | 372/46 |
| 5,568,499 A | * | 10/1996 | Lear | 372/45 |
| 5,594,751 A | | 1/1997 | Scott | 372/46 |
| 5,719,893 A | * | 2/1998 | Jiang et al. | 372/45 |
| 5,733,712 A | * | 3/1998 | Tanaka et al. | 430/314 |
| 5,742,630 A | * | 4/1998 | Jiang et al. | 372/50 |
| 5,751,757 A | * | 5/1998 | Jiang et al. | 372/50 |
| 5,838,705 A | * | 11/1998 | Shieh et al. | 372/45 |
| 5,974,069 A | * | 10/1999 | Tanaka et al. | 372/46 |
| 6,021,147 A | * | 2/2000 | Jiang et al. | 372/46 |
| 6,061,381 A | * | 5/2000 | Adams et al. | 372/96 |

OTHER PUBLICATIONS

Y. A. Wu et al., Single–Mode, Passive Antiguide Vertical Cavity Surface Emitting Laser, Jun. 1995, pp. 629–637.
Yoo et al., Transverse Mode Characteristics of Vertical–Cavity Surface–Emitting Lasers Buried in Amorphous GaAs Antiguide Layer, Oct. 1997, pp. 1–7.

* cited by examiner

Primary Examiner—Frank G. Font
Assistant Examiner—Delma R. Flores Ruiz
(74) Attorney, Agent, or Firm—Cohen, Pontani, Lieberman & Pavane

(57) ABSTRACT

A single mode surface emitting laser and its manufacturing method are provided. The surface emitting laser which has a characteristic of single transverse mode radiation in the broad region using reflectivity distribution of a reflector layer with an antiguide clad is provided. The single mode surface emitting laser comprises an n-type semiconductor substrate having an n-type lower electrode and an antireflection film thereunder, a laser pillar formed on the semiconductor substrate, the laser pillar having a bottom DBR, an active layer and a top DBR, a control layer formed on said laser pillar, the control layer consisting of a compound semiconductor of which energy gap is larger than radiation wavelength, an antiguide clad layer covering an outer portion of the laser pillar including the control layer and has higher reflective index than those of the active layer or the top DBR forming the laser pillar, a top electrode formed on the antiguide clad layer and the control layer, and an insulation film between the antiguide clad layer and the top electrode.

4 Claims, 4 Drawing Sheets

SINGLE MODE SURFACE EMITTING LASER

BACKGROUND OF THE INVENTION

1. Field of the Invention

The present invention relates to a single mode surface emitting laser, and more particularly to a single mode surface emitting laser which has a characteristic of single transverse mode radiation in the broad region using reflectivity distribution of a reflector layer with antiguide clad.

2. Description of the Related Art

The vertical-cavity surface-emitting laser of semiconductor laser is used as an optical source for optical communication and parallel optical communication since it has merits of high coupling efficiency with optical fiber and easiness of two dimensional array manufacturing. However, the radiation characteristic of it should be improved in order to apply the vertical-cavity surface-emitting laser as a proper optical source of system. Particularly, a stable transverse mode characteristic is one of the most needed characteristics for the stable coupling with optical fiber and free space optical interconnection.

The vertical-cavity surface-emitting laser emits light in the vertical direction of the substrate and shows a single longitudinal mode characteristic in the longitudinal direction and multiple mode in the traverse direction in accordance with its characteristic of structure. This is caused by the fact the difference of loss between modes in the transverse direction is not large and spatial hole burn phenomena. There are two methods to improve such characteristics, one is to get a single transverse mode characteristic by making current injection region smaller than the mode width of beam and by preventing the occurrence of spatial hole burn, and the other is to control the radiation of higher order transverse mode by closing the light passing width with optical aperture. Also, there is a method of controlling the radiation by increasing the propagation loss of higher order transverse mode using the antiguide clad. For example, if the transverse mode characteristic is improved largely using amorphous GaAs as antiguide clad, it is possible to obtain single transverse mode characteristics to the size of a specified device. That is, the transverse mode is stabilized by the method of increasing the round trip loss of higher order transverse mode using the antiguide structure. However, it has some limitation to obtain stable transverse mode characteristics of broad region and large device using the antiguide only since the round trip loss decreases steeply as the device size increases.

SUMMARY OF THE INVENTION

Therefore, it is possible to improve the single mode radiation characteristic by controlling the spatial distribution of reflection of top reflector as well as antiguide clad and then increasing the loss of higher degree transverse mode without changing the loss of fundamental transverse mode in large.

In view of such aspect, it is an object of the present invention to provide a surface emitting laser which shows a single transverse mode radiation mode characteristic in a broad region in order to use it as an optical source for free space optical interconnection and optical fiber coupling.

A single mode surface emitting laser according to the present invention comprises an n-type semiconductor substrate which has an n-type lower electrode and an antireflection film under it, a laser pillar which is a stacked structure of bottom DBR, an active layer and a top DBR sequentially on the semiconductor substrate, a control layer of compound semiconductor whose energy gap is higher than its radiation peak, and which has different thicknesses spatially since the layer becomes thick on the center of the laser pillar and thin on the edge of it, an antiguide clad layer which is formed in the edge part of the laser pillar including the control layer and has higher refractive index than those of the active layer or the top DBR forming the laser pillar, and a top electrode which is formed on the antiguide clad layer and the control layer, and a insulation film between the antiguide clad layer and the top electrode.

A method for manufacturing a single mode surface emitting laser according to the present invention comprise the steps of forming a bottom DBR, an active layer, a top DBR and a control layer on an n-type semiconductor substrate sequentially, forming an antireflection film and an n-type bottom electrode under the semiconductor substrate, and etching the selected regions of the control layer, the top DBR, the active layer and the bottom DBR sequentially in order to form a laser pillar; forming a photo resistive film on the entire structure of the laser pillar, etching a part of the control layer at the same time of removing the photo resistive film so that the control layer has different thicknesses spatially by etching the control layer a little bit on the center part and etching deeply on the edge; and depositing an antiguide layer and a insulation film on the entire structure including the laser pillar sequentially, etching the insulation film and the antiguide clad layer to expose the control layer, and forming top electrode on the entire structure.

The above and further objects, aspects and novel features of the present invention will become more apparent from the following detailed description when read in connection with the accompanying drawings.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DESCRIPTION OF THE PREFERRED EMBODIMENT

Figure 1:
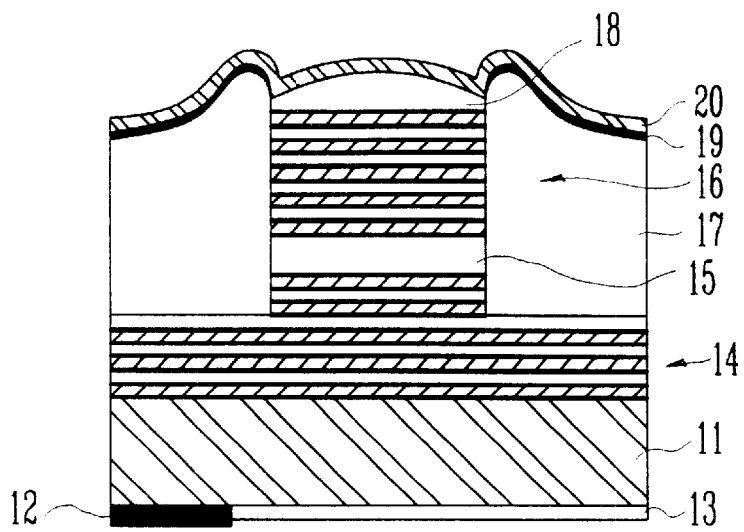
FIG. 1 is a cross sectional view showing a single mode surface emitting laser according to the invention.

FIG. 1 shows a cross sectional view of a single mode surface emitting laser according to the present invention, a laser of bottom-emitting vertical cavity type surface emitting laser.

As shown in the FIG. 1, the single mode surface emitting laser according to the present invention is formed on an antireflection film 13 having an n-type bottom electrode 12. An antireflection film 13 is deposited on the backside of a semiconductor substrate 11 of n-type compound such as GaAs and a bottom distributed bragg reflector (DBR) 14, an active region 15 and a top DBR 16 are sequentially formed on the substrate 13. The bottom DBR 14 is a semiconductor DBR in which the n-type compound semiconductors of two or more having different refractive index such as AlGaAs and GaAs are grown alternately. The active region 15 consists of a gain region and a space region, whose material is a compound of AlGaAs, GaAs or InGaAs. The top DBR 16 is a semiconductor DBR in which the p-type compound semiconductors of two or more having different refractive index such as AlGaAs, GaAs are grown alternately. Also, in order to increase the propagation loss of higher order transverse mode in the light cavity, an antiguide clad region 17 is formed beside the active region 15 and the top DBR 16, whose material is such an amorphous GaAs and whose refractive index is higher than that of compound semiconductor forming the top DBR 16 or the active region 15 such as GaAs or AlGaAs. Then, a control region 18 is formed on the top DBR 16, which is a compound semiconductor region whose energy gap is higher than radiation wavelength and has different thicknesses spatially in order that the reflectivity of entire top DBR has non uniform distribution spatially. That is, the control region 18 which is etched partially and has dome shape in its top surface controls the phase difference between the light reflected from the top electrode 20 formed of metal reflector on the top of control region 18 and the light reflected from top DBR 16 and then controls the reflectivity distribution. There is a dielectric film 19 formed between the top electrode 20 and the antiguide clad region 17.

The laser of the invention has the maximum reflectivity in the center of the pillar and lower reflectivity as it goes to the edges. So most light converges in the center of laser pillar. Therefore, the output loss of fundamental transverse mode does not change in large, and the radiation of higher order transverse mode is controlled by increasing the loss of higher order transverse mode which is dispersed in the edge of the laser pillar. Accordingly, a stable transverse mode characteristic can be obtained, whose fundamental transverse mode is emitted mainly in a broad region.

Figure 2A:
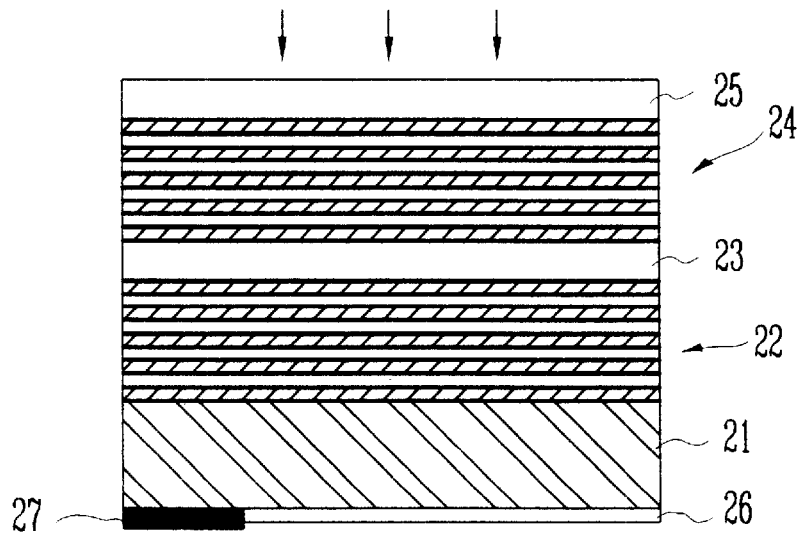
FIGS. 2a through 2f are cross sectional views showing a method for manufacturing a single mode surface emitting laser according to the present invention.

As shown in FIG. 2a, a bottom DBR 22, an active layer 23, a top DBR 24 and a reflectivity control layer 25 are formed sequentially on a compound semiconductor substrate 21. Particularly, the top DBR 24 is formed of 15 periodes, each period having stacked structure of AlAs/AlGaAs/AlGaAs. Then, after the backside of semiconductor substrate 21 is polished and the antireflection layer 26 consisting of SiOx and TiOx is then deposited on the polished face using an electron beam evaporation method, the bottom n-type electrode 27 is formed by selectively etching the antireflection layer 26 in the edge of the substrate selectively.

Figure 2B:
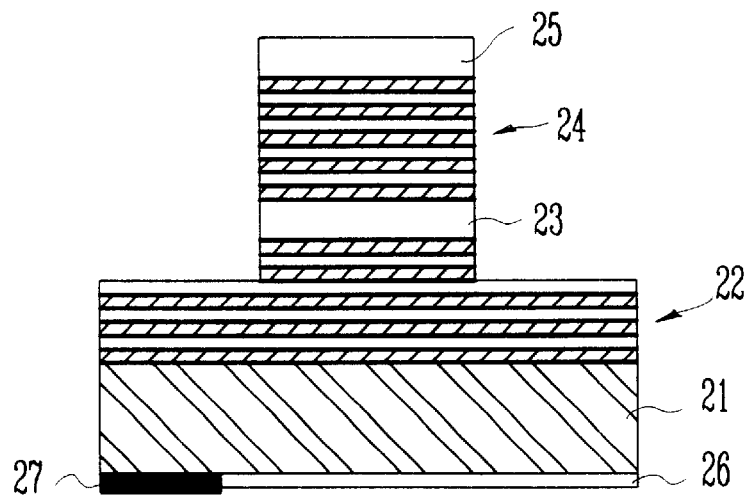

FIG. 2b is a cross sectional view in which the laser pillar is formed by sequentially dry-etching the control layer 25, the top DBR 24, the active layer 23 and partially the bottom DBR 22 with $Cl_2$ gas and Ar gas using a photo resistive film (not shown) as a mask.

Figure 2C:
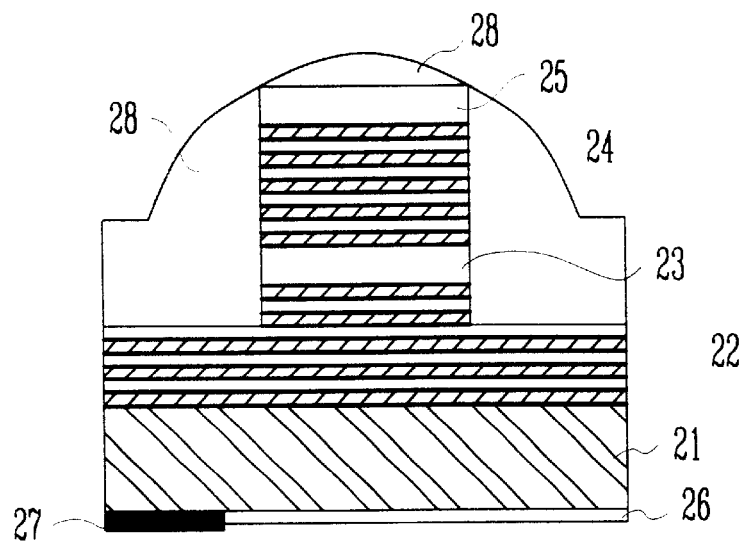

FIG. 2c shows a cross sectional view in which a photo resistive film 28 is formed on the entire structure of the laser pillar. Here, the photo resistive film 28 is formed on the laser pillar by depositing the photo resistive film using a spin coating method controlling spin velocity, and by performing the heat treatment under the control of temperature to make the shape shown in the FIG. 2c. If the photo sensitive film is formed on the laser pillar of thickness 1 to 4 $\mu$m, the thickness of remaining photo sensitive film 28 on the top of the pillar becomes thin generally, and the thickness becomes thin at a constant rate in accordance with distance from the center of the pillar. The shape of it depends on its spin speed and the temperature of heat treatment.

Figure 2D:
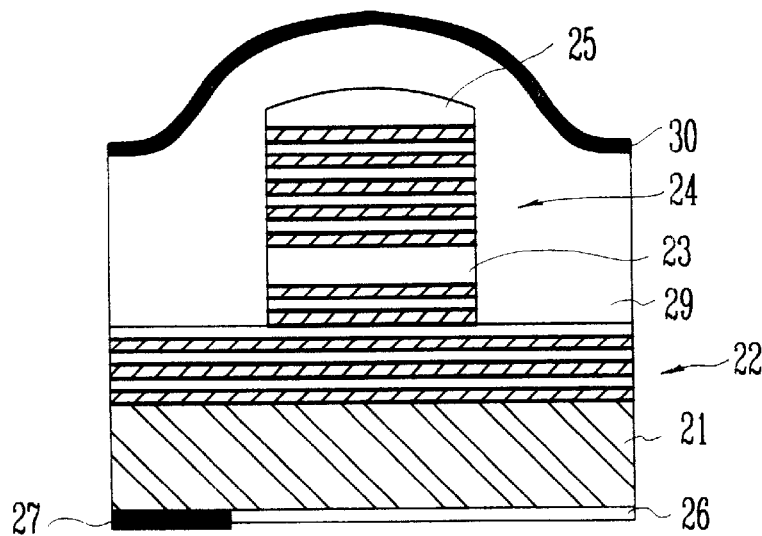

FIG. 2d is a cross-sectional view in which an antiguide clad layer 29 and an insulation film 30 are formed sequentially after etching the photo resistive film 28 and a part of the control layer 25 simultaneously. That is, using the dry etching method with $Cl_2$, Ar, $CF_4$ and $O_2$ gases, the photo resistive film 28 and a part of the control layer 25 are removed simultaneously by controlling the etch depth of the control layer 25 selectively according to the shape of the photo resistive film 28. Here, the control layer 25 has different thicknesses spatially by etching the center part of the laser pillar a little bit and by etching the edge part of it deeply. Then, the antiguide clad layer 29 having higher refractive index than compound semiconductor consisting of the top DBR 24 or the active layer 23, and the insulation film 30 is formed using a material such as SiNx or SiOx on it.

Figure 2E:
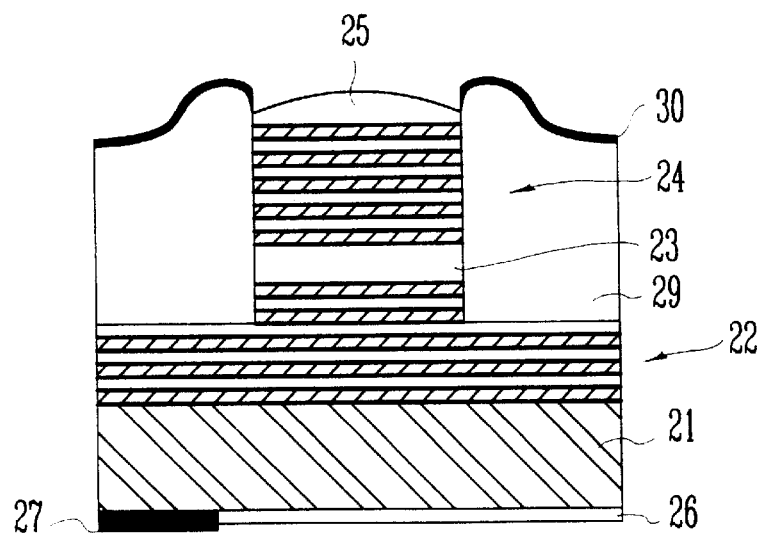

As shown in FIG. 2e, using a mask pattern, the insulation film 30 and the antiguide clad layer 29 on the top of laser pillar are etched sequentially.

Figure 2F:
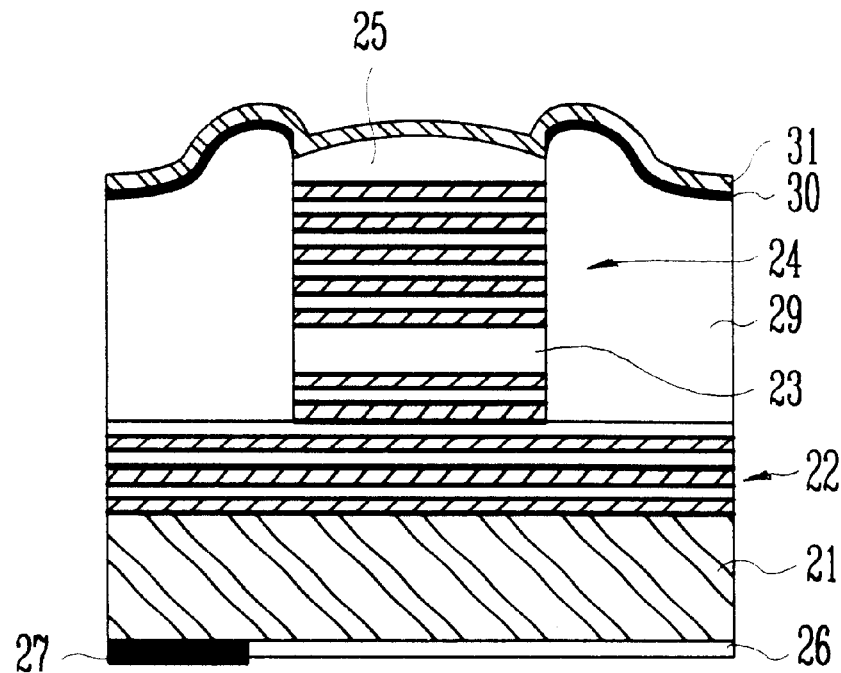

FIG. 2f shows a cross sectional view in which a single mode surface emitting laser is completed by forming a top electrode 31 using the high reflectivity materials such as Au, Cr, and Al on the entire structure.

Figure 3:
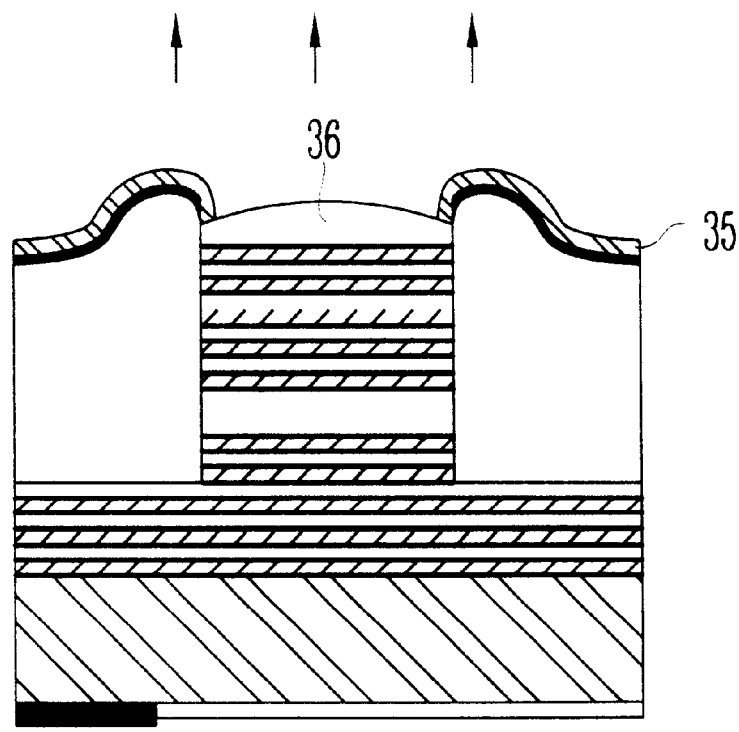
FIG. 3 shows an another embodiment of a single mode surface emitting laser according to the present invention.

FIG. 3 shows an another embodiment of a single mode surface emitting laser according to the present invention, whose type is a top emitting single mode surface emitting laser. It has the same basic structure of the bottom-emitting vertical cavity surface-emitting laser shown in FIG. 1 and a window without electrode is formed in the center of the laser pillar in order to expose the control layer 36 for radiation of the laser light. In this case, the reflectivity distribution can be changed by controlling the phase of light reflected from interface with air changing the thickness of the control layer 36.

Figure 4:
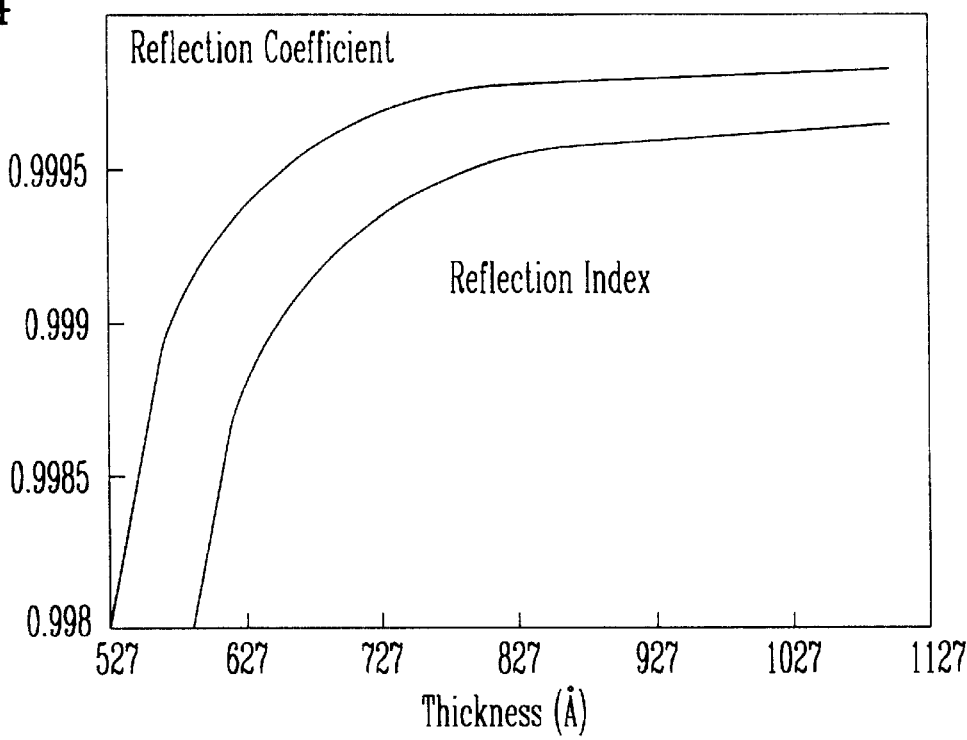
FIG. 4 is a graph which shows reflectivity variations to the thicknesses of the reflectivity control layer of a single mode surface emitting laser according to the present invention.
Figure 5:
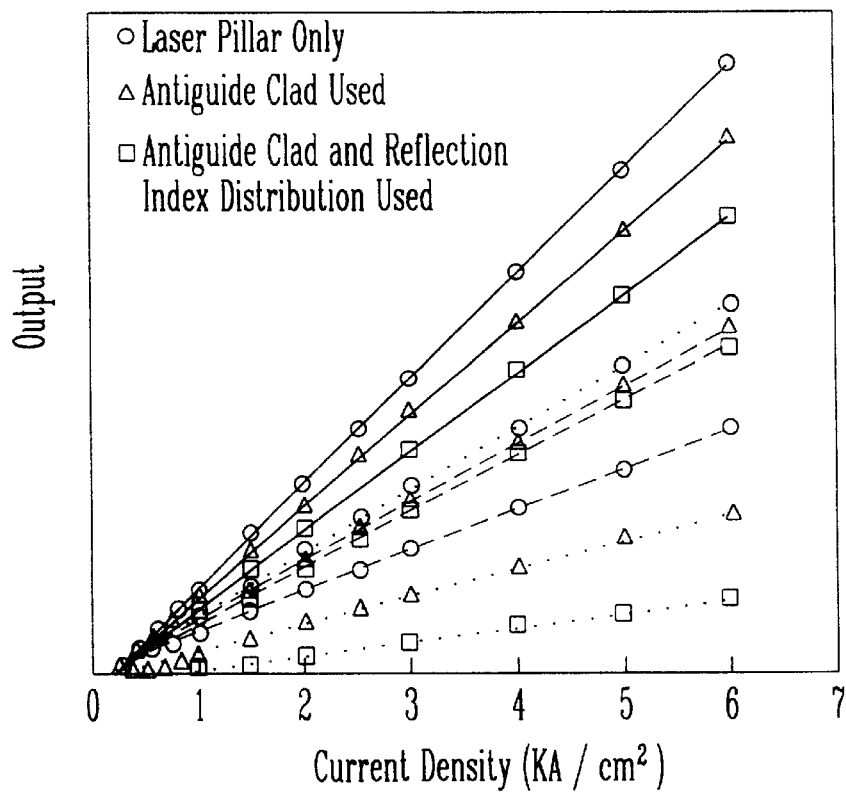
FIG. 5 is an output characteristic graph which shows a transverse mode characteristic of a single mode surface emitting laser according to the present invention.

FIG. 4 is a graph which calculates reflectivity variations of the top DBR to the thicknesses of the reflectivity control layer of single mode surface emitting laser according to the present invention, and FIG. 5 is an output characteristic graph which shows a transverse mode characteristic of the single mode surface emitting laser according to the present invention.

FIG. 4 shows a graph view in which the reflectivity of the top DBR, that is the top DBR, the control layer and the top electrode are measured according to the thickness variation of the control layer in the bottom emitting structure of laser output wavelength 990 $\mu$m.

As shown in the FIG. 4, the reflectivity are maximum in the control layer of thickness 109 nm, and they decrease as the thickness of the control layer becomes thin. Therefore, the reflectivity distribution of the top DBR of laser can be controlled by etching only edge part of the top control layer of the laser pillar selectively.

FIG. 5 shows the contribution to the outputs of fundamental transverse mode and first order transverse mode in the three cases that only the laser pillar is used, the antiguide clad is used, and the antiguide clad and the reflectivity distribution according to the present invention are used respectively. Here, a solid line, an oblique line and a dotted line represent outputs of entire, fundamental transverse mode and first order transverse mode, respectively. In the laser which has laser light emitting diameter of 15 $\mu$m, in the case that there is the laser pillar only, the first order transverse mode starts to emit immediately and appears to contribute to the output much more than fundamental mode. However, in the case of using the antiguide clad, the first order transverse mode appears a little bit. And, in the case of controlling the reflectivity distribution of the invention, since the contribution of first order transverse mode decreases and the contribution quantity of fundamental transverse mode becomes large, the characteristic of transverse mode can be improved in large.

The single mode surface emitting laser of the present invention makes it possible to perform a single transverse mode radiation in a broad region and in a large size device, and therefore, it can be used stably in case of coupling with the optical fiber and the free space optical interconnection.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and the spirit of the present invention are to be encompassed as further embodiments of the present invention.

What is claimed is:

1. A single mode surface emitting laser, comprising:

an n-type semiconductor substrate having an n-type lower electrode and an antireflection film thereunder;

a laser pillar formed on the semiconductor substrate, the laser pillar having a bottom DBR, an active layer and a top DBR;

a control layer formed on said laser pillar, the control layer consisting of a compound semiconductor of which energy gap is larger than radiation wavelength;

an antiguide clad layer covering an outer portion of the laser pillar including the control layer and has higher refractive index than those of the active layer or the top DBR forming the laser pillar;

a top electrode formed on the antiguide clad layer and the control layer; and an insulation film between the antiguide clad layer and the top electrode.

2. A single mode surface emitting laser according to claim 1, wherein the bottom DBR is a structure which stacks two or more n-type compound semiconductors having different refractive index alternately.

3. A single mode surface emitting laser according to claim 1, wherein the top DBR is a structure which stacks two or more p-type compound semiconductors having different refractive index alternately.

4. The single mode surface emitting laser according to claim 1, wherein the control layer has different spatially.

* * * * *